US011636908B2

(12) United States Patent
Moschiano et al.

(10) Patent No.: US 11,636,908 B2
(45) Date of Patent: *Apr. 25, 2023

(54) GLOBAL-LOCAL READ CALIBRATION (71) Applicant: Micron Technology, Inc., Boise, ID (US)

(72) Inventors: Violante Moschiano, Avezzano (IT); Walter Di Francesco, Avezzano (IT); Kishore Kumar Muchherla, Fremont, CA (US); Vamsi Pavan Rayaprolu, San Jose, CA (US); Jeffrey Scott McNeil, Jr., Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/485,087

(22) Filed: Sep. 24, 2021

(65) Prior Publication Data
US 2022/0130482 A1   Apr. 28, 2022

Related U.S. Application Data (63) Continuation of application No. 17/083,138, filed on Oct. 28, 2020, now Pat. No. 11,177,014.

(51) Int. Cl.
*G11C 29/12* (2006.01)
*G11C 29/02* (2006.01)
(Continued)

(52) U.S. Cl.
CPC ...... *G11C 29/12005* (2013.01); *G11C 29/021* (2013.01); *G11C 29/14* (2013.01); *G11C 29/20* (2013.01)

(58) Field of Classification Search
CPC . G11C 29/12005; G11C 29/20; G11C 29/021; G11C 29/14
See application file for complete search history.

(56) References Cited

U.S. PATENT DOCUMENTS 8,072,805 B2 * 12/2011 Chou ............... G11C 11/5642
                                                365/185.09
8,125,827 B2 *  2/2012 Park ............... G11C 16/3431
                                                365/185.11
(Continued)

OTHER PUBLICATIONS

Global-Local Read Calibration, U.S. Appl. No. 17/083,138, filed Oct. 28, 2020, Violante Moschiano et al., Patented Case, Oct. 27, 2021.

*Primary Examiner* — Mohammed A Bashar
(74) *Attorney, Agent, or Firm* — Greenberg Traurig (57) ABSTRACT

A memory device to calibrate voltages used to read a group of memory cells. For example, the memory device measures first signal and noise characteristics of a group of memory cells by reading the group of memory cells at first test voltages that are separated from each other by a first voltage interval. An estimate of a read level of the group of memory cells is determined based on the first signal and noise characteristics. The memory device then measures second signal and noise characteristics of the group of memory cells by reading the group of memory cells at second test voltages that are separated from each other by a second voltage interval that is smaller than the first voltage interval. An optimized read voltage for the read level is computed from the second signal and noise characteristics.

20 Claims, 8 Drawing Sheets

(51) Int. Cl.
G11C 29/20 (2006.01)
G11C 29/14 (2006.01)

(56) References Cited

U.S. PATENT DOCUMENTS

| | | |
|---|---|---|
| 10,347,344 B2 * | 7/2019 | Malshe ................ G11C 16/349 |
| 11,177,014 B1 | 11/2021 | Moschiano et al. |
| 2003/0081445 A1 | 5/2003 | Van Brocklin et al. |
| 2015/0006983 A1 | 1/2015 | Lin et al. |
| 2019/0295660 A1 | 9/2019 | Malshe et al. |
| 2020/0176063 A1 * | 6/2020 | Malshe ................ G11C 16/04 |

* cited by examiner

FIG. 8

GLOBAL-LOCAL READ CALIBRATION

RELATED APPLICATIONS

The present application is a continuation application of U.S. patent application Ser. No. 17/083,138 filed Oct. 28, 2020 and issued as U.S. Pat. No. 11,177,014 on Nov. 16, 2021, the entire disclosures of which application are hereby incorporated herein by reference.

TECHNICAL FIELD

At least some embodiments disclosed herein relate to memory systems in general, and more particularly, but not limited to memory systems configured to determine voltages for reading data from memory cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

At least some aspects of the present disclosure are directed to a memory sub-system configured to calibrate, using a global-local calibration technique, voltages used to read a group of memory cells. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a threshold voltage. For example, if the memory cell is configured/programmed in a state that allows a substantial current to pass the memory cell at the threshold voltage, the memory cell is storing a bit of one; and otherwise, the memory cell is storing a bit of zero. Further, a memory cell can store multiple bits of data by being configured/programmed differently at multiple threshold voltages. For example, the memory cell can store multiple bits of data by having a combination of states at the multiple threshold voltages; and different combinations of the states of the memory cell at the threshold voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Data can be encoded with redundant information to facilitate error detection and recovery. When data encoded with redundant information is stored in a memory sub-system, the memory sub-system can detect errors in data retrieved directly from the memory cells in the memory sub-system and/or recover the original data that is used to generate the data for storing in the memory cells. The recovery operation can be successful (or have a high probability of success) when the data retrieved directly from the memory cells in the memory sub-system contains fewer errors, or the bit error rate in the retrieved data is low. For example, error detection and data recovery can be performed using techniques such as Error Correction Code (ECC), Low-Density Parity-Check (LDPC) code, etc.

When the data retrieved from the memory cells of the memory sub-system has too many errors for successful decoding, the memory sub-system may retry the execution of the read command with adjusted parameters for reading the memory cells. However, it is inefficient to search for a set of parameters through multiple read retry with multiple rounds of calibration, reading, decoding failure, and retry, until the encoded data retrieved from the memory cells can be decoded into error free data. For example, blind searching for the optimized read voltages is inefficient. For example, one or more commands being injected between retry reads can lead to long latency for recovering data from errors.

Conventional calibration circuitry has been used to self-calibrate a memory region in applying read level signals to account for shift of threshold voltages of memory cells within the memory region. During the calibration, the calibration circuitry is configured to apply different test signals to the memory region to count the numbers of memory cells that output a specified data state for the test signals. Based on the counts, the calibration circuitry determines a read level offset value as a response to a calibration command.

At least some aspects of the present disclosure address the above and other deficiencies using a global-local read voltage calibration technique.

For example, a coarse voltage interval (e.g., 300 mV) can be used to sample the signal and noise characteristics of a group of memory cells over a wide, global voltage range where one or more read levels can be found. A read level identifies a voltage for reading the memory cells to retrieve data stored in the memory cells. Based on the coarse sampling of the signal and noise characteristics of a group of memory cells, coarse estimates of the read levels/read voltages can be determined at the valleys/local minimum points of the distribution of the signal and noise characteristics over the wide, global voltage range. Subsequently, for each coarse estimate of the read levels, a fine voltage interval (e.g., 40 mV or 50 mV) can be used to sample the signal and noise characteristics of a group of memory cells in a narrow, local voltage range identified by the coarse estimate. A calibrated read level provides an optimized voltage for reading the memory cells and thus retrieving data with a reduced/minimized bit error rate. Such a calibrated read level, or optimized read voltage, can be determined from a local minimum in the distribution of the signal and noise characteristics over the narrow, local voltage range.

For example, in response to a command from a controller of a memory sub-system, a memory device can automatically calibrate the read levels of a group of memory cells using the global-local calibration technique and read the group of memory cells using the calibrated read levels.

For example, in response to a failure in decoding data retrieved from a group of memory cells based on a set of previously known read levels, the memory device can perform the global-local read calibration to establish a new set of read levels for the group of memory cells. The global-local read calibration can be performed in response to a read retry, or an explicit command/request for the global-local read calibration.

For example, when it is predicted that charge loss, read disturb, cross-temperature effect, etc. may have caused significant shifts in read levels in a group of memory cells, a global-local read calibration can be performed proactively to avoid a failure in decoding data retrieved from the group of memory cells.

The signal and noise characteristics measured for memory cells can be based on a bit count of memory cells in the group having a predetermined status when a test voltage is applied to read the memory cells. The group of memory cells can have different bit counts at different test voltages that are separated from one another by a predetermined voltage interval or gap. The difference between bit counts of two adjacent test voltages provides the count difference for the voltage interval or gap between the adjacent test voltages. An optimized read voltage can be found at a voltage where the distribution of the count differences over voltage reaches a minimum.

When a memory cell is configured to store multiple bits, the memory cell has multiple read levels over a wide voltage range (e.g., 6 V). It is efficient to sample the wide voltage range for a distribution of count differences at a coarse voltage interval (e.g., 300 mV) to discover the approximate locations of the read levels and then use a fine voltage interval (e.g., 40 to 50 mV) to calibrate the read levels near the discovered approximate locations with high precision. For example, the entire local voltage range for the fine calibration of a read level can be smaller than the coarse voltage interval for the discovery/estimation of the approximate locations of the read levels.

Figure 1:
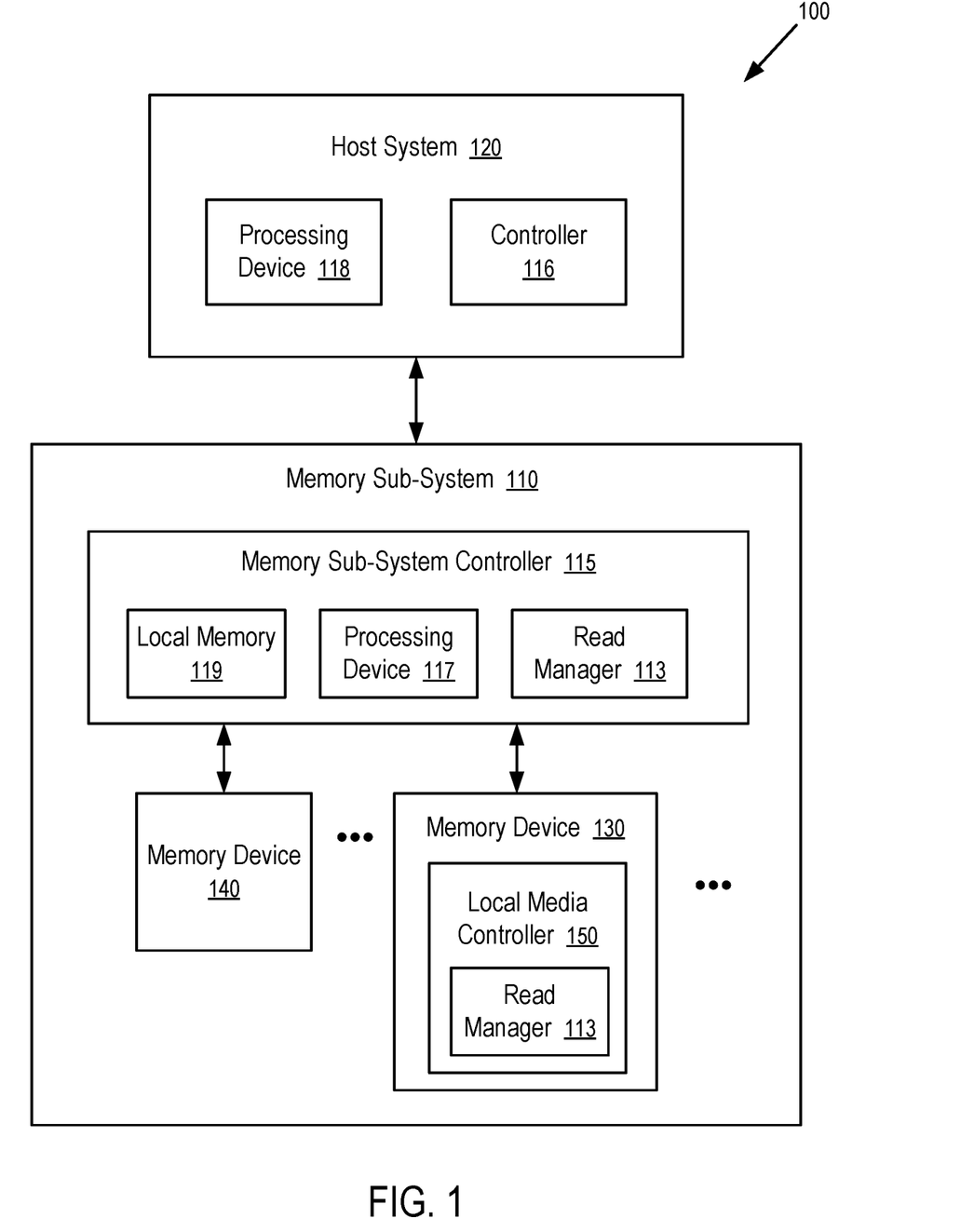
FIG. 1 illustrates an example computing system having a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from the memory sub-system 110 into information for the host system 120.

The controller 116 of the host system 120 can communicate with the controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (e.g., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (e.g., processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with the memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 150) for media management within the same memory device package. An example of a managed memory device is a managed NAND (MNAND) device.

The controller 115 and/or a memory device 130 can include a read manager 113 configured to identify and/or calibrate read levels of a group of memory cells based on signal and noise characteristics of the group of memory cells. In some embodiments, the controller 115 in the memory sub-system 110 includes at least a portion of the read manager 113. In other embodiments, or in combination, the controller 116 and/or the processing device 118 in the host system 120 includes at least a portion of the read manager 113. For example, the controller 115, the controller 116, and/or the processing device 118 can include logic circuitry implementing the read manager 113. For example, the controller 115, or the processing device 118 (e.g., processor) of the host system 120, can be configured to execute instructions stored in memory for performing the operations of the read manager 113 described herein. In some embodiments, the read manager 113 is implemented in an integrated circuit chip disposed in the memory sub-system 110. In other embodiments, the read manager 113 can be part of firmware of the memory sub-system 110, an operating system of the host system 120, a device driver, or an application, or any combination therein.

For example, the read manager 113 implemented in the controller 115 can transmit a command to the memory device 130. In response to such a command, the read manager 113 implemented in the memory device 130 is configured to measure first signal and noise characteristics of a group of memory cells by reading the group of memory cells at a plurality of first test voltages configured over a global voltage range that is known to contain the read levels of the memory cells. Based on the measured first signal and noise characteristics, the read manager 113 can identify estimates of the read levels with a first precision level corresponding to the voltage interval among the first test voltages. For each of the estimates of the read levels, the read manager 113 can further measure second signal and noise characteristics of the group of memory cells by reading the group of memory cells at a plurality of second test voltages configured to cover a local voltage range near the corresponding estimate. A read level is calibrated from the measured second signal and noise characteristics with a second precision level corresponding to the voltage interval among the second test voltages. Since the voltage interval among the second test voltages is smaller than the voltage interval among the first test voltages, the second precision level is higher than the first precision level. The voltage interval among the first test voltages can be configured to obtain the first precision level such that the estimates of the read levels obtained from the first signal and noise characteristics is sufficient to place the local voltage range of the second test voltages to cover the calibrated read level. The voltage interval among the first test voltages can be configured to obtain the second precision level such that data retrieved from the memory cells using the calibrated read level has a reduced/minimized bit error rate for successful decoding.

Figure 2:
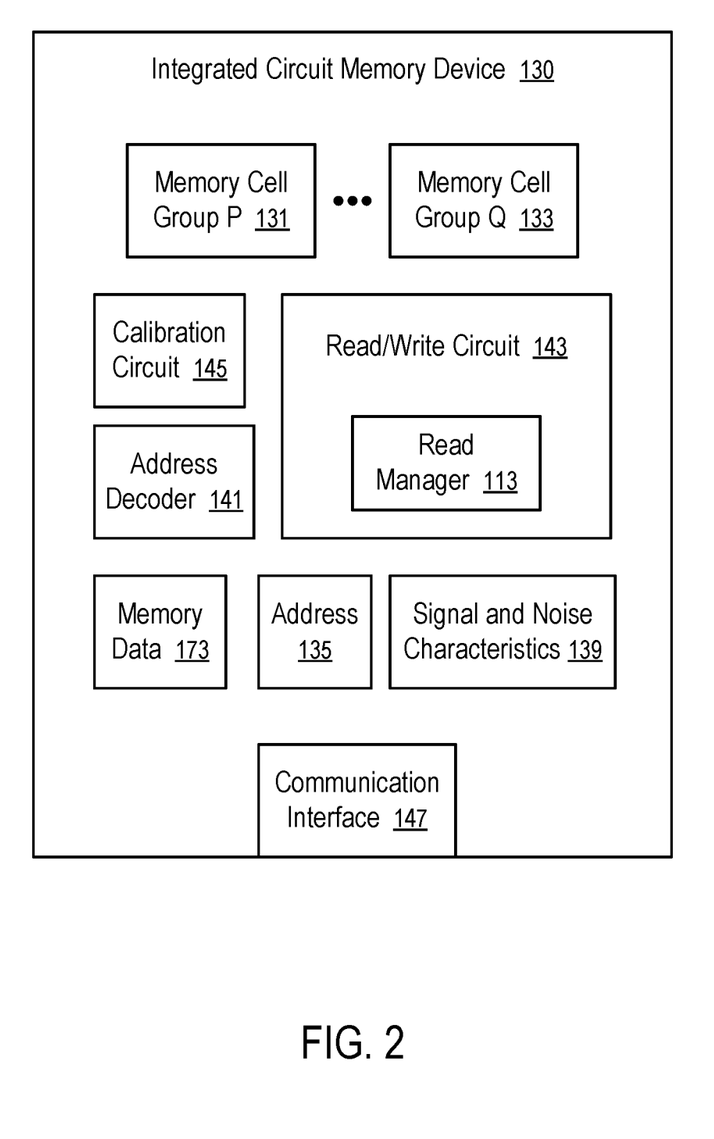
FIG. 2 illustrates an integrated circuit memory device having a calibration circuit configured to measure signal and noise characteristics according to one embodiment.

FIG. 2 illustrates an integrated circuit memory device 130 having a calibration circuit 145 configured to measure signal and noise characteristics according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, . . . , 133 of memory cells that can be formed in one or more integrated circuit dies. A typical memory cell in a group 131, . . . , 133 can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive a command having an address 135 from the controller 115 of a memory sub-system 110, retrieve memory data 173 from memory cells identified by the memory address 135, and provide at least the memory data 173 as part of a response to the command. Optionally, the memory device 130 may decode the memory data 173 (e.g., using an error-correcting code (ECC) technique) and provide the decoded data as part of a response to the command. An address decoder 141 of the integrated circuit memory device 130 converts the address 135 into control signals to select a group of memory cells in the integrated circuit memory device 130; and a read/write circuit 143 of the integrated circuit memory device 130 performs operations to determine the memory data 173 stored in the memory cells at the address 135.

The integrated circuit memory device 130 has a calibration circuit 145 configured to determine measurements of signal and noise characteristics 139 of memory cells in a group (e.g., 131, . . . , or 133). For example, the statistics of memory cells in a group or region that has a particular state at one or more test voltages can be measured to determine the signal and noise characteristics 139. Optionally, the signal and noise characteristics 139 can be provided by the memory device 130 to the controller 115 of a memory sub-system 110 via the communication interface 147.

In at least some embodiments, the calibration circuit 145 and/or the read manager 113 can determine the optimized read voltages of the group of memory cells based on the signal and noise characteristics 139.

For example, based on an estimate of a read level, the calibration circuit 145 and/or the read manager 113 can obtain different read responses of the memory cells in a group (e.g., 131, . . . , 133) by varying test voltages used to read the memory cells. The test voltages are configured within a local range centered at the estimate to obtain a calibrated read level having a precision level represented by the voltage interval of the test voltages.

Further, when there is the lack of an estimate of a read level to configure the test voltages of the fine calibration such that the limited range of the test voltages covers the optimized read level, the calibration circuit 145 and/or the read manager 113 can perform a global calibration to discover an estimate of the read level with a sufficient accuracy to position the test voltages of the fine calibration. The global calibration is similarly performed by obtaining different read responses of the memory cells by varying test voltages, but with a coarse voltage interval to improve efficiency in searching for the estimate of the read level. For example, the coarse voltage interval can be equal to, or larger than, the voltage interval of the test voltages used in fine calibration.

For example, the calibration circuit 145 can measure the signal and noise characteristics 139 on the fly when executing a command to read the memory data 173 from the address 135. Since the signal and noise characteristics 139 is measured as part of the operation to read the memory data 173 from the address 135, the signal and noise characteristics 139 can be used in the read manager 113 with reduced penalty on the latency in the execution of the command to read the memory data 173 from the address 135.

Figure 3:
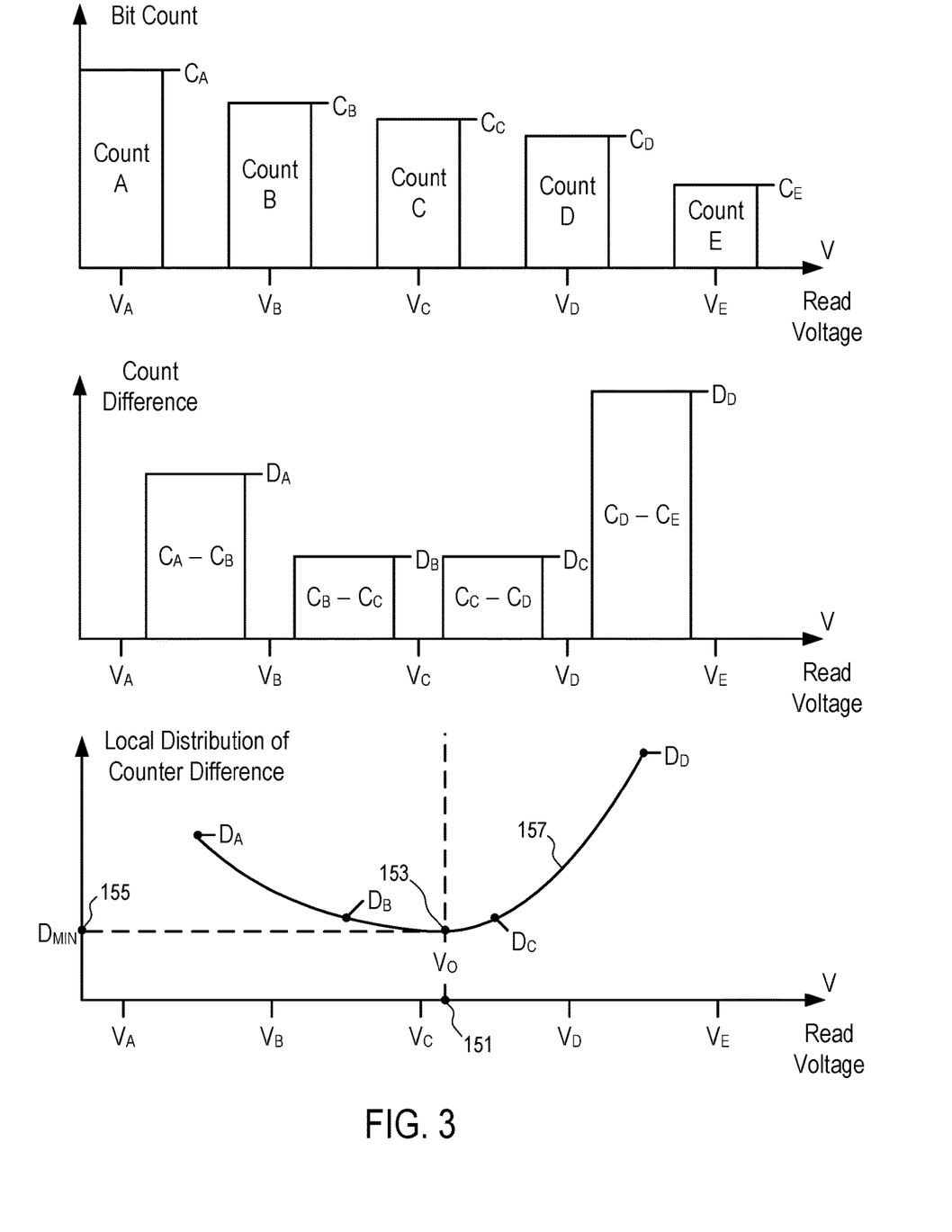
FIG. 3 shows an example of measuring signal and noise characteristics to improve memory operations according to one embodiment.

FIG. 3 shows an example of measuring signal and noise characteristics 139 to improve memory operations according to one embodiment.

In FIG. 3, the calibration circuit 145 applies different read voltages $V_A$, $V_B$, $V_C$, $V_D$, and $V_E$ to read the states of memory cells in a group (e.g., 131, ..., or 133). In general, more or less read voltages can be used to generate the signal and noise characteristics 139.

As a result of the different voltages applied during the read operation, a same memory cell in the group (e.g., 131, ..., or 133) may show different states. Thus, the counts $C_A$, $C_B$, $C_C$, $C_D$, and $C_E$ of memory cells having a predetermined state at different read voltages $V_A$, $V_B$, $V_C$, $V_D$, and $V_E$ can be different in general. The predetermined state can be a state of having substantial current passing through the memory cells, or a state of having no substantial current passing through the memory cells. The counts $C_A$, $C_B$, $C_C$, $C_D$, and $C_E$ can be referred to as bit counts.

The calibration circuit 145 can measure the bit counts by applying the read voltages $V_A$, $V_B$, $V_C$, $V_D$, and $V_E$ one at a time on the group (e.g., 131, ..., or 133) of memory cells.

Alternatively, the group (e.g., 131, ..., or 133) of memory cells can be configured as multiple subgroups; and the calibration circuit 145 can measure the bit counts of the subgroups in parallel by applying the read voltages $V_A$, $V_B$, $V_C$, $V_D$, and $V_E$. The bit counts of the subgroups are considered as representative of the bit counts in the entire group (e.g., 131, ..., or 133). Thus, the time duration of obtaining the counts $C_A$, $C_B$, $C_C$, $C_D$, and $C_E$ can be reduced.

For example, the group of memory cells can be applied the voltage $V_C$ to obtain the bit count $C_C$. Then, the voltage applied to four subgroups of the memory cells can be boost modulated to $V_A$, $V_B$, $V_C$ and $V_E$ respective to obtain the bit counts for the four subgroups at $V_A$, $V_B$, $V_C$ and $V_E$. The bit counts for the subgroups can be scaled up according to their ratio of memory cells in the group to obtain the bit counts $C_A$, $C_B$, $C_C$ and $C_E$ respectively. Thus, the time to measure the bit counts $C_A$ to $C_E$ can be reduced significantly.

In some embodiments, the bit counts $C_A$, $C_B$, $C_C$, $C_D$, and $C_E$ are measured during the execution of a command to read the data from the address 135 that is mapped to one or more memory cells in the group (e.g., 131, ..., or 133). Thus, the controller 115 does not need to send a separate command to request for the signal and noise characteristics 139 that is based on the bit counts $C_A$, $C_B$, $C_C$, $C_D$, and $C_E$.

The differences between the bit counts of the adjacent voltages are indicative of the errors in reading the states of the memory cells in the group (e.g., 133, ..., or 133) caused by changing the voltage used to read the memory cells.

For example, the count difference $D_A$ is calculated from $C_A$-$C_B$, which is an indication of error introduced by changing the read voltage from $V_A$ to $V_B$.

Similarly, $D_B = C_B$-$C_C$; $D_C = C_C$-$C_D$; and $D_D = C_D$-$C_E$.

The count difference distribution 157, obtained based on the count differences $D_A$, $D_B$, $D_C$, and $D_D$, represents the prediction of error as a function of the read voltage. From the count difference distribution 157 (and/or the count differences), the optimized read voltage 151 $V_O$ can be calculated as the local minimum point 153 that provides the lowest $D_{MIN}$ on the count difference distribution 157.

After the optimized read voltage $V_O$ is calculated from the count difference distribution 157 represented by the count differences $D_A$, $D_B$, $D_C$, and $D_D$, the read/write circuit 143 can use the optimized read voltage $V_O$ to read the data from the memory cells at the address 135 using the optimized read voltage $V_O$. The optimized read voltage $V_O$ can be stored as an estimated read level for the next operation and/or communicated to the controller 115 of the memory sub-system 110. Optionally, the count differences $D_A$, $D_B$, $D_C$, and $D_D$ can also be communicated to the controller 115 of the memory sub-system 110.

FIG. 3 illustrates an example of generating a set of statistical data (e.g., bit counts and/or count differences) for reading at an optimized read voltage $V_O$. In general, a group of memory cells can be configured to store more than one bit in a memory cell; and multiple read voltages are used to read the data stored in the memory cells. A set of statistical data can be similarly measured for each of the read voltages to identify the corresponding optimized read voltage, where the test voltages in each set of statistical data are configured in the vicinity of the expected location of the corresponding optimized read voltage. Thus, the signal and noise characteristics 139 measured for a memory cell group (e.g., 131 or 133) can include multiple sets of statistical data measured for the multiple threshold voltages respectively.

For example, the controller 115 can instruct the memory device 130 to perform a read operation by providing an address 135 and at least one read control parameter. For example, the read control parameter can be a suggested read level/voltage.

The memory device 130 can perform the read operation by determining the states of memory cells at the address 135 at a read voltage and provide the data according to the determined states.

During the read operation, the calibration circuit 145 of the memory device 130 generates the signal and noise characteristics 139. The data and the signal and noise characteristics 139 are provided from the memory device 130 to the controller 115 as a response. Alternatively, the processing of the signal and noise characteristics 139 can be performed at least in part using logic circuitry configured in the memory device 130. For example, the processing of the signal and noise characteristics 139 can be implemented partially or entirely using the processing logic configured in the memory device 130. For example, the processing logic can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

The signal and noise characteristics 139 can be determined based at least in part on the read control parameter. For example, when the read control parameter is a suggested read voltage $V_C$ for reading the memory cells at the address 135, the calibration circuit 145 can compute the read voltages $V_A$, $V_B$, $V_C$, $V_D$, and $V_E$ that are in the vicinity of the suggested read voltage according to a voltage interval.

The signal and noise characteristics 139 can include the bit counts $C_A$, $C_B$, $C_C$, $C_D$, and $C_E$. Alternatively, or in combination, the signal and noise characteristics 139 can include the count differences $D_A$, $D_B$, $D_C$, and $D_D$.

The precision of the calibrated/optimized read voltage 151 is limited by the voltage interval among the test voltages $V_A$, $V_B$, $V_C$, $V_D$, and $V_E$. Reducing the voltage interval can improve the accuracy of the calibrated/optimized read voltage 151. However, reducing the voltage interval reduces the voltage range $V_A$ to $V_E$ and thus increases the chance of the optimized read voltage 151 being outside of the voltage range $V_A$ to $V_E$. When the optimized read voltage 151 is outside of the voltage range $V_A$ to $V_E$, the count differences $D_A$, $D_B$, $D_C$, and $D_D$ may be insufficient to determine the optimized read voltage 151 accurately.

In some instances, there is the lack of an estimate $V_C$ of a read level with accuracy that is sufficient to position the test voltage range $V_A$ to $V_E$ to cover the optimized read voltage $V_O$. For example, charge loss, read disturb, cross-temperature effect, etc. can cause large shifts in read levels such the previously known read levels are inaccurate enough to be used as estimates of the read levels to configure the test voltages of the fine calibration using the voltage interval among the test voltages $V_A$, $V_B$, $V_C$, $V_D$, and $V_E$. It is inefficient to search for read levels using the voltage interval of the fine calibration.

Figure 4:
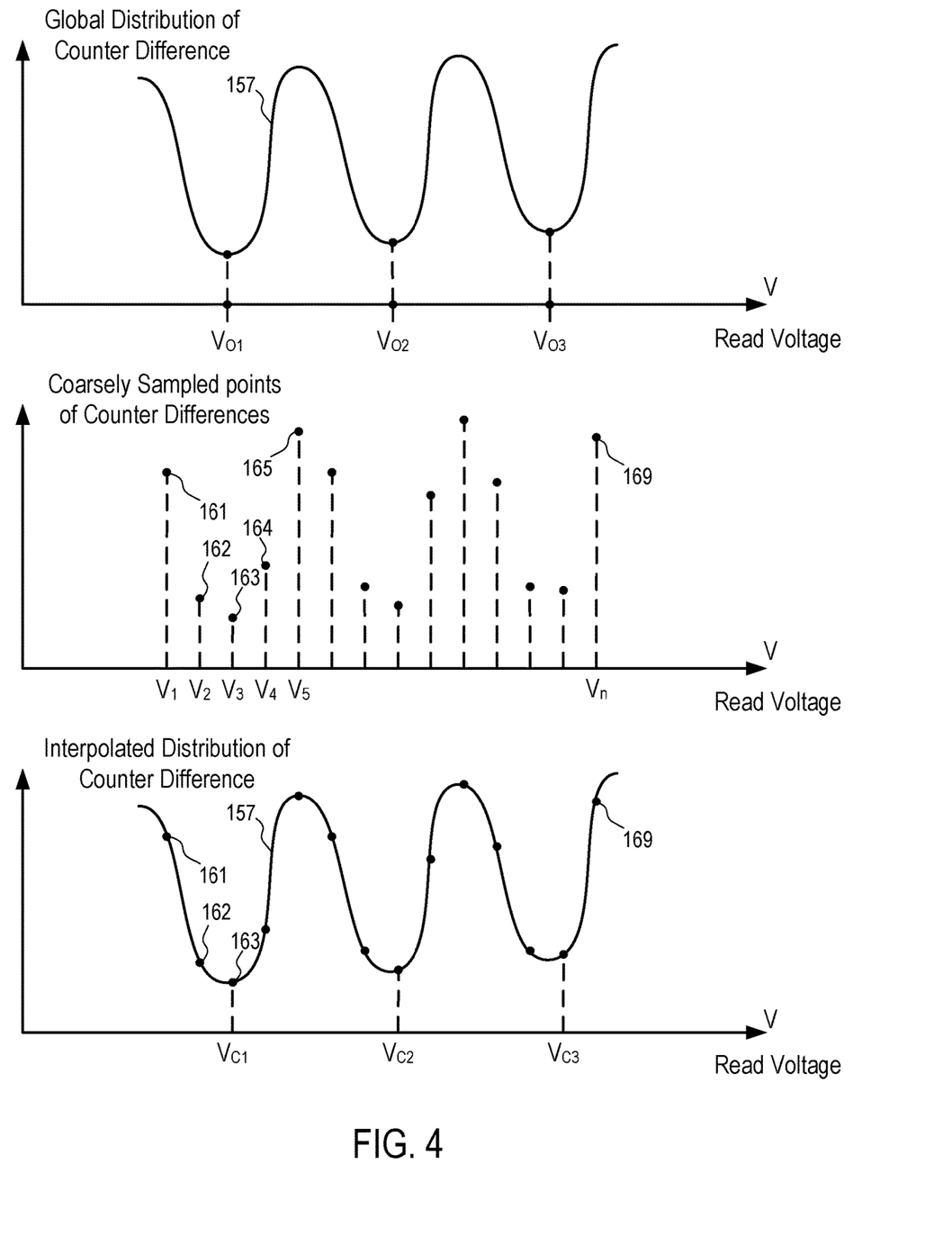
FIG. 4 illustrates a technique to measure global signal and noise characteristics and identify global read levels according to one embodiment.

In such a situation, a large voltage interval can be used to search globally for estimates of read levels, as illustrated in FIG. 4.

FIG. 4 illustrates a technique to measure global signal and noise characteristics and identify global read levels according to one embodiment.

A count difference distribution 157 in FIG. 4 illustrates the locations of optimized read voltages $V_{O1}$, $V_{O2}$, $V_{O3}$, etc. of a memory cell group (e.g., 131 or 133). In general, the optimized read voltages $V_{O1}$, $V_{O2}$, $V_{O3}$, etc. can be in a wide voltage range (e.g., 6 V). A coarse voltage interval (e.g., 200 mV to 400 mV) can be used to measure count differences at a series of test voltages $V_1$, $V_2$, $V_3$, ..., $V_n$. For example, a count difference 161 can be measured for test voltage $V_1$; a count difference 162 can be measured for test voltage $V_2$; a count difference 163 can be measured for test voltage $V_3$; and a count difference 169 can be measured for test voltage $V_n$. The count differences 161 to 169 can be measured in a way similar to the measuring of count differences $D_A$ to Do in FIG. 3.

In FIG. 4, the voltage interval among the test voltages $V_1$ to $V_n$ is larger than the voltage interval among the test voltages $V_A$ to $V_E$ in FIG. 3. For example, the voltage interval among the test voltages $V_1$ to $V_n$ can be equal to, or larger than, the test voltage range $V_A$ to $V_E$ in FIG. 3 for improved efficiency in search for the estimates of the optimized read voltages $V_{O1}$, $V_{O2}$, $V_{O3}$, etc.

For example, the estimates $V_{C1}$, $V_{C2}$, $V_{C3}$ of the optimized read voltages $V_{O1}$, $V_{O2}$, $V_{O3}$ can be determines as the test voltages that have count differences lower than their neighbors on both sides. For example, count difference 163 at a test voltage $V_3$ is lower than the count difference 162 at a test voltage $V_2$ and the count difference 164 at a test voltage $V_4$ to reach a local minimum on the set of count differences 161 to 169; and thus, the test voltage $V_3$ can be selected as the estimate $V_{C1}$ of a read voltage level corresponding to the optimized read voltage $V_{O1}$. Using the estimate $V_{C1}$ as the center test voltage $V_C$ in FIG. 3, an optimized read voltage $V_O$ can be calibrate/calculated according to the accuracy level of the voltage interval among $V_A$ to $V_E$ in FIG. 3.

Optionally, a more precise/accurate estimate $V_{C1}$ can be calculated from a set of count differences centered at the test voltage $V_3$. For example, an interpolation of the count difference distribution 157 over the test voltages $V_2$ to $V_4$ centered at test voltage $V_3$ can be used to determine a more precise/accurate estimate $V_{C1}$ that reaches a local minimum in the interpolation. For example, an interpolation of the count difference distribution 157 over the test voltages $V_1$ to $V_5$ (or over another set of test voltages near the test voltage $V_3$ that has the lowest count differences in the set) can be used to determine a more precise/accurate estimate $V_{C1}$ that reaches a local minimum in the interpolation.

Since the estimate $V_{C1}$ is determined based on the count difference 161 at the count difference 162 at $V_2$, the count difference 163 at $V_3$, the count difference 164 at $V_4$, and/or the count difference 165 at $V_5$, the estimate $V_{C1}$ has an error smaller than the voltage interval among the test voltage voltages $V_1$ to $V_5$. Thus, the test voltage range $V_A$ to $V_E$ centered at the estimate $V_{C1}$ is expected to cover the optimized read voltage/level $V_{O1}$.

In some embodiments, the calibration circuit 145 and/or the read/write circuit 143 can change from one test voltage in FIG. 3 to another voltage within the test voltage range $V_A$ to $V_E$ through boost modulation to reduce the time for reading the memory cells at different test voltages. After an optimized read voltage $V_O$ is determined, the applied voltage can be further boost modulated to the optimized read voltage $V_O$ to obtain the memory data 173 at the corresponding read level.

The voltage range that can be reached via boost modulation can be limited. For example, the calibration circuit 145 and/or the read/write circuit 143 may not be able to change applied voltage from one test voltage (e.g., $V_1$) to another (e.g., $V_2$) in FIG. 4.

Optionally, the calibration circuit 145 and/or the read/write circuit 143 can read subgroups of memory cells in a group (e.g., 131 or 133) in parallel at different voltages to reduce the time to measure the count differences 161 to 169 in FIG. 4. The statistics (e.g., bit counts) measured for a subgroup can be scaled to obtain the statistics of the group.

Figure 5:
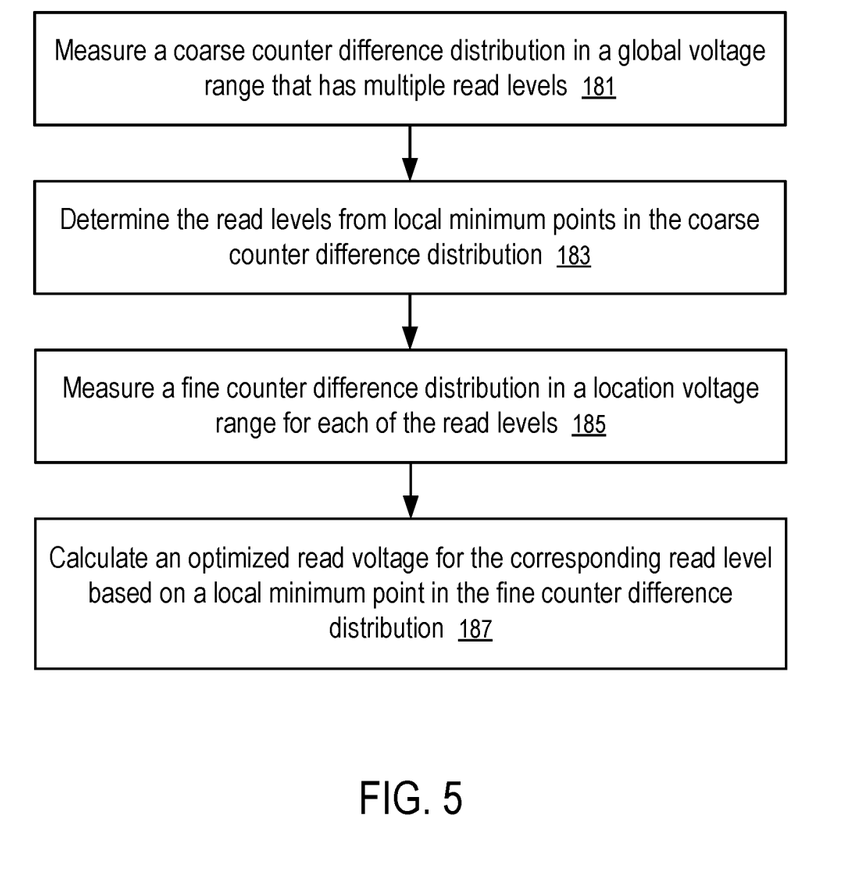
FIGS. 5-7 show methods to calibrate read voltages according to some embodiments.
Figure 6:
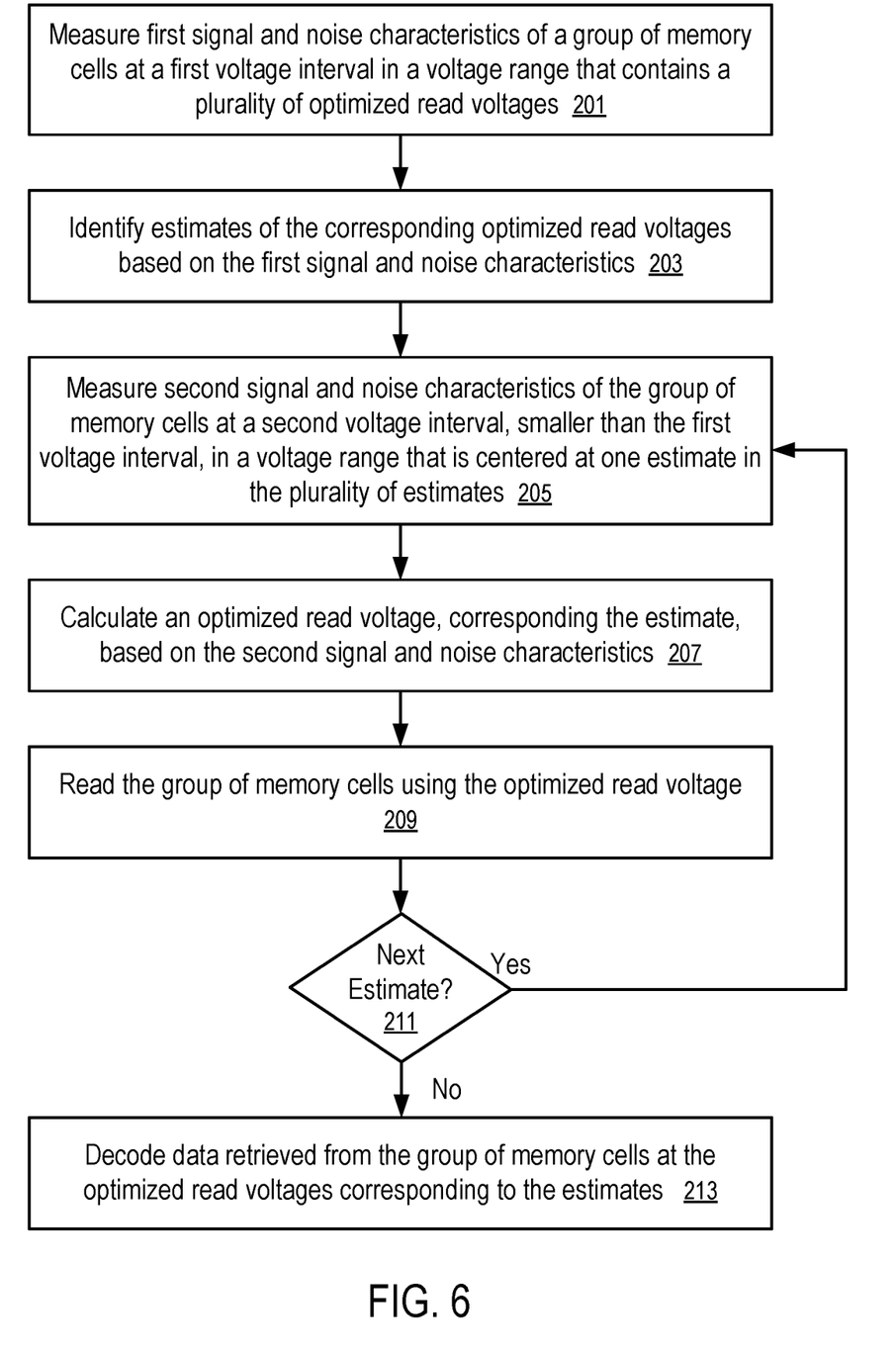
Figure 7:
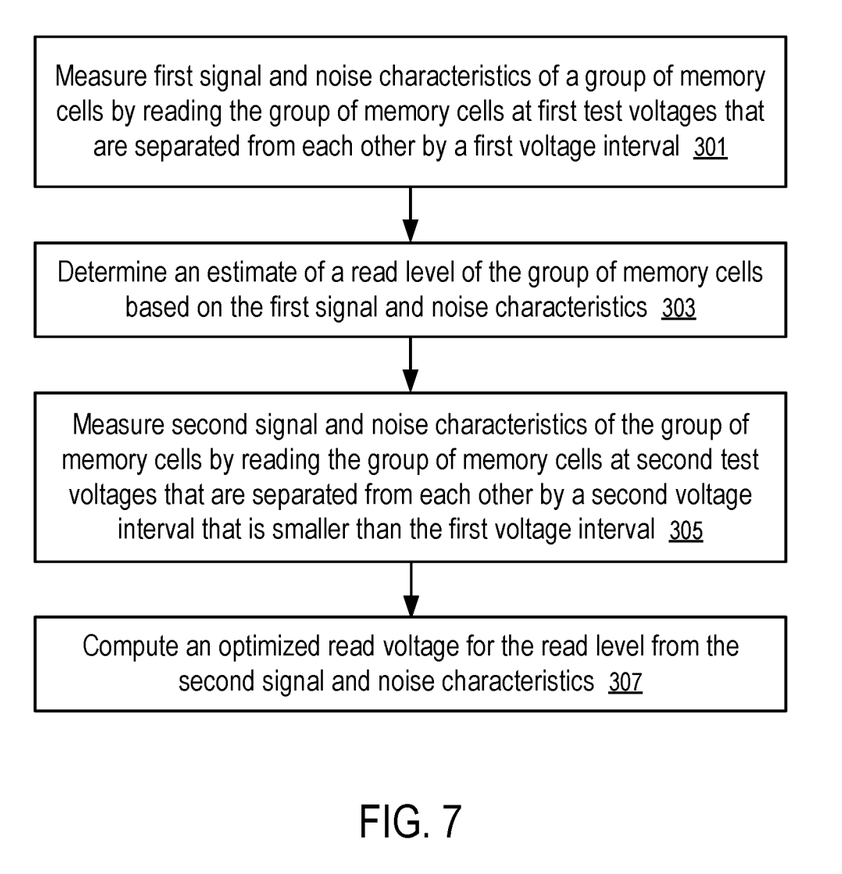

FIGS. 5-7 show methods to calibrate read voltages according to some embodiments. The methods of FIGS. 5, 6, and/or 7 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 5, 6 or 7 is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the methods of FIGS. 5-7 can be performed in a memory sub-system 110 illustrated in FIG. 1 using a calibration circuit 145 of an integrated circuit memory device 130 of FIG. 2, and using the global-local read calibration techniques of FIGS. 3 and 4.

In FIG. 5, at block 181, a read manager 113 measures a coarse count difference distribution in a global voltage range that has multiple read levels.

For example, the global voltage range can be the entire voltage range $V_1$ to $V_n$ where all of the read levels of optimized read voltages $V_{O1}$, $V_{O2}$, $V_{O3}$, etc. can be found, as illustrated in FIG. 5.

Alternatively, the global voltage range can be a portion of the entire voltage range $V_1$ to $V_n$ where one or more of the read levels of optimized read voltages $V_{O1}$, $V_{O2}$, $V_{O3}$, etc. can be found.

At block 183, the read manager 113 determines the read levels $V_{C1}$, $V_{C2}$, $V_{C3}$, etc. from local minimum points in the coarse count difference distribution.

For example, the precision of the read levels $V_{C1}$, $V_{C2}$, $V_{C3}$, etc. can be controlled by the voltage interval used to measure the coarse count difference distribution over the global voltage range. For efficiency, the precision is calibrated to be low such that if the read levels $V_{C1}$, $V_{C2}$, $V_{C3}$, etc. are used to read the group of memory cells, it is highly likely that the bit error rate in the retrieved memory data 173 is so high that the decoding (e.g., using an error-correcting code (ECC) technique) would fail. However, the precision is calibrated to be sufficient to allow a fine calibration in a local region identified by each of the read levels $V_{C1}$, $V_{C2}$, $V_{C3}$, etc. to be successful.

For example, the voltage interval used to measure the coarse count difference distribution over the global voltage range can be between 200 mV to 400 mV.

At block 185, the read manager 113 measures a fine count difference distribution in a location voltage range for each of the read levels.

For example, the read level $V_{C1}$ can be used as the center test voltage $V_C$ in the fine calibration according FIG. 3. The test voltage range $V_A$ to $V_E$ in the fine calibration according to FIG. 3 can be equal to, or smaller than, the voltage interval used to measure the coarse count difference distribution over the global voltage range. The voltage interval used to measure the fine count difference distribution as in FIG. 3 can be configured to allow voltage changes via boost modulation and/or a fine calibration of the read level with a precision such that memory data 173 retrieved using the calibrated read level can be decoded successfully (e.g., using an error-correcting code (ECC) technique).

At block 187, the read manager 113 calculates an optimized read voltage $V_O$ for the corresponding read level (e.g., $V_{C1}$, $V_{C2}$, or $V_{C3}$) based on a local minimum point in the fine count difference distribution.

The measuring of the fine count difference distributions for individual read levels $V_{C1}$, $V_{C2}$, $V_{C3}$, etc., can be performed after the measuring of the entire coarse count difference distribution over the global voltage range.

Alternatively, the measuring of the fine count difference distributions for individual read levels $V_{C1}$, $V_{C2}$, $V_{C3}$, etc., can be interleaved with the measuring of the entire coarse count difference distribution over the global voltage range. For example, after detecting/discovering the read level $V_{C1}$ from the count differences at voltages near $V_3$, the fine calibration according to FIG. 3 can be performed to determine the optimized read voltage Vo1 for the read level $V_{C1}$, before the read manager 113 continues the measurement of further count differences to detect/discover the next read level $V_{C2}$.

In FIG. 6, at block 201, a read manager 113 measures first signal and noise characteristics of a group of memory cells at a first voltage interval (e.g., 300 mV) in a voltage range (e.g., 6V) that contains a plurality of optimized read voltages (e.g., $V_{O1}$, $V_{O2}$, $V_{O3}$, etc.).

For example, the first signal and noise characteristics can be a coarse count difference distribution as discussed in FIG. 5 and/or illustrated in FIG. 4.

Optionally, the read manager 113 and/or the calibration circuit 145 can measure the first signal and noise characteristics of the group of memory cells by measuring subgroups of the memory cells in parallel. For example, the group of memory cells can be divided into four subgroups. Each of the subgroups can be read using a different test voltage to obtain a bit count. It can be assumed that the bit count in a subgroup or the entire group is proportional to the number of memory cells in the subgroup or the entire group. Thus, the bit count of a subgroup can be scaled according to the ratio between the numbers of memory cells in the subgroup and in the entire group to obtain the bit count of the group. Thus, the bit counts of the group at four different test voltages can be obtained in parallel.

At block 203, the read manager 113 identifies estimates (e.g., $V_{C1}$, $V_{C2}$, $V_{C3}$, etc.) of the corresponding optimized read voltages (e.g., $V_{O1}$, $V_{O2}$, $V_{O3}$, etc.) based on the first signal and noise characteristics, as illustrated in FIG. 4.

At block 205, the read manager 113 measures second signal and noise characteristics of the group of memory cells at a second voltage interval (e.g., 40 mV or 50 mV), smaller than the first voltage interval (e.g., 300 mV), in a voltage range (e.g., 160 mV or 200 mV) that is centered at one estimate (e.g., $V_C$) in the plurality of estimates (e.g., $V_{C1}$, $V_{C2}$, $V_{C3}$, etc.).

At block 207, the read manager 113 calculates an optimized read voltage (e.g., $V_O$), corresponding the estimate (e.g., $V_C$), based on the second signal and noise characteristics, as illustrated in FIG. 3.

At block 209, the read manager 113 reads the group of memory cells using the optimized read voltage (e.g., $V_O$).

At block 211, the read manager 113 makes decisions to repeat the operations of blocks 205 to 209 for each of the plurality of estimates (e.g., $V_{C1}$, $V_{C2}$, $V_{C3}$, etc.).

At block 213, the read manager 113 decodes memory data 173 retrieved from the group of memory cells at the optimized read voltages (e.g., $V_{O1}$, $V_{O2}$, $V_{O3}$, etc.) corresponding to the estimates (e.g., $V_{C1}$, $V_{C2}$, $V_{C3}$, etc.).

Optionally, the read manager 113 identifies an estimate at block 203 and makes decisions at block 211 to repeat operations of block 203 to 209 for each of the plurality of estimates (e.g., $V_{C1}$, $V_{C2}$, $V_{C3}$, etc.).

In FIG. 7, at block 301, a read manager 113 measures first signal and noise characteristics of a group of memory cells by reading the group of memory cells at first test voltages that are separated from each other by a first voltage interval.

For example, the first voltage interval can be between 200 mV to 400 mV (e.g., 300 mV).

For example, the first signal and noise characteristics identify a distribution of count difference (e.g., distribution 157 illustrated in FIG. 4) over the first test voltages (e.g., $V_1$, $V_2$, $V_3$, $V_4$, $V_5$, ..., $V_n$ in FIG. 4) according to bit counts on the first test voltages respectively.

In general, a respective bit count at a test voltage identifies a number of memory cells in the group that, when read at the test voltage, provide a predetermined bit value; and a respective count difference between two adjacent test voltages represents a difference between bit counts at the adjacent test voltages respectively.

A bit count for a memory cell group can be measured by reading the memory cells in the entire group, or by reading a subgroup of the memory cells as a sample. Further, subgroups can be read at different voltages in parallel to reduce the time period used for measuring the signal and noise characteristics of the memory cell group.

At block 303, the read manager 113 determines an estimate of a read level of the group of memory cells based on the first signal and noise characteristics.

For example, the estimate of a read level (e.g., $V_{C1}$, $V_{C2}$, or $V_{C3}$ in FIG. 4) can be determined according to a local minimum of the distribution of count difference (e.g., distribution 157 in FIG. 4) identified by the first signal and noise characteristics, as illustrated in FIG. 4.

At block 305, the read manager 113 measures second signal and noise characteristics of the group of memory cells by reading the group of memory cells at second test voltages that are separated from each other by a second voltage interval that is smaller than the first voltage interval.

For example, the second signal and noise characteristics identify a distribution of count difference (e.g., distribution 157 illustrated in FIG. 3) over the second test voltages (e.g., $V_A$ to $V_E$ in FIG. 3) according to bit counts on the second test voltages respectively.

For example, the second voltage interval can be between 40 mV to 50 mV. Thus, the entire voltage range of the second test voltages (e.g., from $V_A$ to $V_E$ in FIG. 3) can be no greater than the first voltage interval (e.g., the gap between $V_1$ and $V_2$ in FIG. 4).

For example, the second voltage interval (e.g., 40 mV to 50 mV) is small such that a test voltage (e.g., $V_A$, $V_C$, or $V_E$) within the voltage range of the second test voltages (e.g., $V_A$ to $V_E$) and applied on the group of memory cells during a read operation (e.g., to determine a bit count) is adjustable via boost modulation to a different read voltage (e.g., $V_B$, $V_C$, or $V_O$) within the voltage range (e.g., $V_A$ to $V_E$) (e.g., to determine another bit count, or to read the memory data 173). In contrast, the test voltages having the first voltage interval (e.g., 300 mV) can be outside of the range reachable via boot modulation.

For example, the second test voltages (e.g., $V_A$ to $V_C$ to $V_E$ in FIG. 3) can be centered on the estimate of the read level (e.g., $V_{C1}$, $V_{C2}$, or $V_{C3}$ in FIG. 4).

At block 307, the read manager 113 computes an optimized read voltage for the read level from the second signal and noise characteristics.

For example, the optimized read voltage (e.g., $V_O$ in FIG. 3) can be computed according to a local minimum of the distribution of count difference (e.g., distribution 157 in FIG. 3) identified by the second signal and noise characteristics, as illustrated in FIG. 3.

For example, after determining the optimized read voltage (e.g., $V_O$ in FIG. 3), the memory device 130 can boost modulate from a test voltage (e.g., $V_A$ or $V_E$) to the optimized read voltage (e.g., $V_O$) to read the group of memory cells using the optimized read voltage (e.g., $V_O$).

Figure 8:
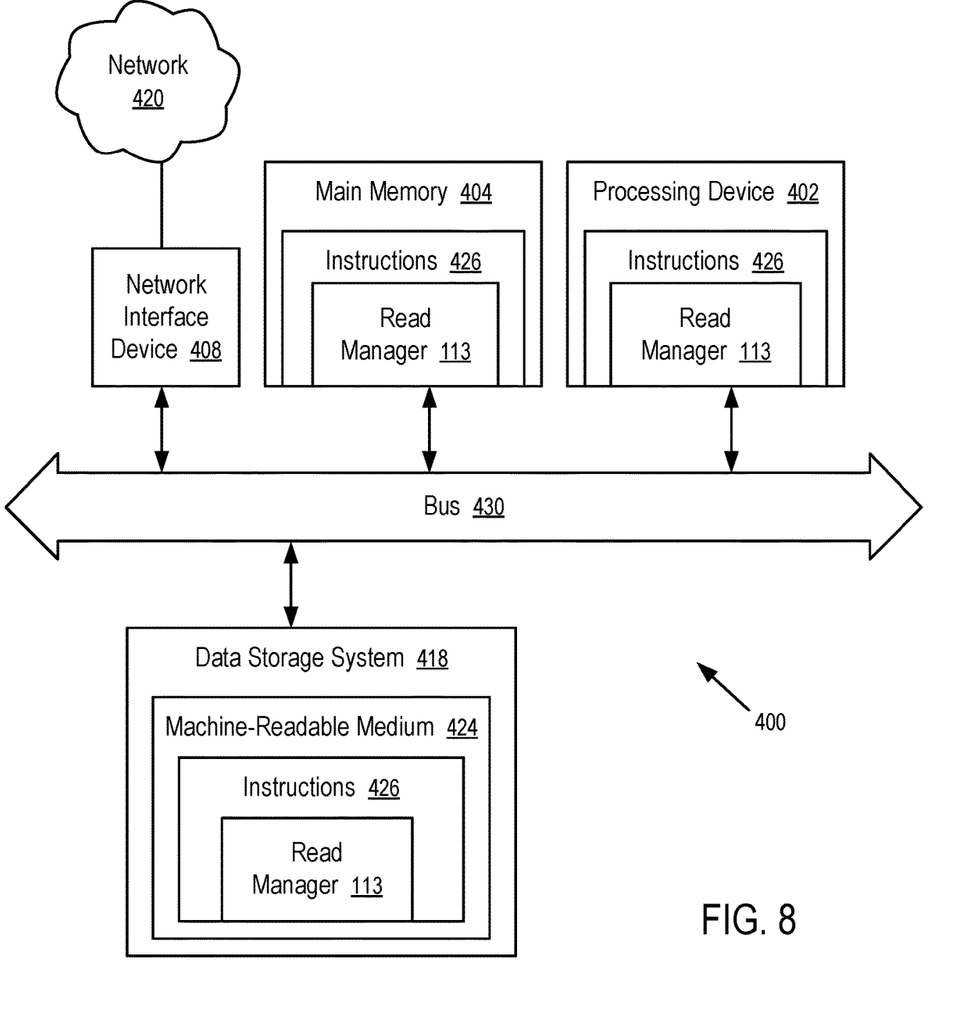
FIG. 8 is a block diagram of an example computer system in which embodiments of the present disclosure can operate.

FIG. 8 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a read manager 113 (e.g., to execute instructions to perform operations corresponding to the read manager 113 described with reference to FIGS. 1-7). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable medium 424, data storage system 418, and/or main memory 404 can correspond to the memory sub-system 110 of FIG. 1.

In one embodiment, the instructions 426 include instructions to implement functionality corresponding to a read manager 113 (e.g., the read manager 113 described with reference to FIGS. 1-7). While the machine-readable medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, $C_D$-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:
    a plurality of memory cells;
    a calibration circuit configured to apply, to the plurality of memory cells, first test voltages at a first interval over a first voltage range, and second test voltages at a second interval smaller than the first interval; and
    a logic circuit configured to:
        determine, for the first test voltages respectively, first counts of memory cells, among the plurality of memory cells, having a predetermined state when the first test voltages are applied;
        identify, based on the first counts for the first test voltages respectively, a second voltage range within the first voltage range; and
        instruct the calibration circuit to apply the second test voltages in the second voltage range.

2. The device of claim 1, comprising:
    an integrated circuit package configured to enclose the device; and
    at least one integrated circuit die, the plurality of memory cells formed on the integrated circuit die.

3. The device of claim 1, wherein the logic circuit is further configured to:
    compute first signal and noise characteristics of the plurality of memory cells based on the first counts; and
    determine an estimate of a read level of the plurality of memory cells based on the first signal and noise characteristics, wherein the second voltage range is identified based on the estimate of the read level.

4. The device of claim 3, wherein the logic circuit is further configured to:

determine, for the second test voltages respectively, second counts of memory cells, among the plurality of memory cells, having the predetermined state when the second test voltages are applied;

compute second signal and noise characteristics of the plurality of memory cells based on the second counts; and compute a read voltage for the read level from the second signal and noise characteristics.

5. The device of claim 4, wherein the second voltage range is no greater than the first interval.

6. The device of claim 5, wherein the first signal and noise characteristics include a distribution of count difference over the first test voltages; and the second signal and noise characteristics include a distribution of count difference over the second test voltages.

7. The device of claim 6, wherein the second voltage range is centered on the estimate of the read level.

8. The device of claim 7, wherein the read voltage corresponds to a local minimum of the distribution of count difference over the second test voltages; and the estimate of the read level corresponds to a local minimum of the distribution of count difference over the first test voltages.

9. The device of claim 7, further comprising:
circuitry configured to boost modulate a current voltage, among the second test voltages, applied on the plurality of memory cells to a next voltage among the second test voltages.

10. A method, comprising:
applying, by a calibration circuit of a memory device and to a plurality of memory cells in the memory device, first test voltages at a first interval over a first voltage range;
determining, by the memory device for the first test voltages respectively, first counts of memory cells, among the plurality of memory cells, having a predetermined state when the first test voltages are applied;
identifying, based on the first counts for the first test voltages respectively, a second voltage range within the first voltage range;
applying, by the calibration circuit and to the plurality of memory cells, second test voltages within the second voltage range at a second interval smaller than the first interval; and
determining, by the memory device for the second test voltages respectively, second counts of memory cells, among the plurality of memory cells, having the predetermined state when the second test voltages are applied.

11. The method of claim 10, wherein the memory device is enclosed within an integrated circuit package; the plurality of memory cells are formed on at least one integrated circuit die; and the method further comprises:
computing first signal and noise characteristics of the plurality of memory cells based on the first counts; and
determining an estimate of a read level of the plurality of memory cells based on the first signal and noise characteristics, wherein the second voltage range is identified based on the estimate of the read level.

12. The method of claim 11, further comprising:
computing second signal and noise characteristics of the plurality of memory cells based on the second counts; and
computing a read voltage for the read level from the second signal and noise characteristics.

13. The method of claim 12, wherein the second voltage range is no greater than the first interval; and the second voltage range is centered on the estimate of the read level.

14. The method of claim 13, wherein the first signal and noise characteristics include a distribution of count difference over the first test voltages; and the second signal and noise characteristics include a distribution of count difference over the second test voltages.

15. The method of claim 14, wherein the read voltage corresponds to a local minimum of the distribution of count difference over the second test voltages; and the estimate of the read level corresponds to a local minimum of the distribution of count difference over the first test voltages.

16. The method of claim 14, further comprising:
boost modulating a current voltage, among the second test voltages, applied on the plurality of memory cells to a next voltage among the second test voltages.

17. A memory sub-system, comprising:
a processing device; and
at least one memory device having a plurality of memory cells formed on an integrated circuit die;
wherein the processing device is configured to transmit, to the memory device, a command configured to identify the plurality of memory cells; and
wherein in response to the command, the memory device is configured to:
apply, to the plurality of memory cells in the memory device, first test voltages at a first interval over a first voltage range;
determine, for the first test voltages respectively, first counts of memory cells, among the plurality of memory cells, having a predetermined state when the first test voltages are applied;
identify, based on the first counts for the first test voltages respectively, a second voltage range within the first voltage range;
apply, to the plurality of memory cells, second test voltages within the second voltage range at a second interval smaller than the first interval; and
determine, by the memory device for the second test voltages respectively, second counts of memory cells, among the plurality of memory cells, having the predetermined state when the second test voltages are applied.

18. The memory sub-system of claim 17, wherein the memory device is enclosed within an integrated circuit package and further configured to:
determine an estimate of a read level of the plurality of memory cells based on the first counts, wherein the second voltage range is identified based on the estimate of the read level; and
compute a read voltage for the read level from the second counts.

19. The memory sub-system of claim 18, wherein the second voltage range is no greater than the first interval; the second voltage range is centered on the estimate of the read level; and the memory device is further configured to boost modulate a current voltage, among the second test voltages, applied on the plurality of memory cells to a next voltage among the second test voltages.

20. The memory sub-system of claim 19, wherein the read voltage corresponds to a local minimum of a distribution of count difference over the second test voltages; and the estimate of the read level corresponds to a local minimum of a distribution of count difference over the first test voltages.

* * * * *